United States Patent
Yu et al.

(10) Patent No.: US 7,137,060 B2
(45) Date of Patent: Nov. 14, 2006

(54) FORWARD ERROR CORRECTION APPARATUS AND METHOD IN A HIGH-SPEED DATA TRANSMISSION SYSTEM

(75) Inventors: Nam-Yul Yu, Suwon-shi (KR); Min-Goo Kim, Suwon-Shi (KR)

(73) Assignee: Samsung Electronics Co., Ltd. (KR)

( * ) Notice: Subject to any disclaimer, the term of this patent is extended or adjusted under 35 U.S.C. 154(b) by 546 days.

(21) Appl. No.: 10/458,204

(22) Filed: Jun. 11, 2003

(65) Prior Publication Data
US 2003/0229843 A1 Dec. 11, 2003

(30) Foreign Application Priority Data
Jun. 11, 2002 (KR) ................. 10-2002-0032690

(51) Int. Cl.
*H03M 13/03* (2006.01)
*H03M 13/00* (2006.01)
(52) U.S. Cl. .................... 714/794; 714/758
(58) Field of Classification Search ................. 714/794, 714/758
See application file for complete search history.

(56) References Cited

U.S. PATENT DOCUMENTS

| | | | | |
|---|---|---|---|---|
| 4,295,218 A | * | 10/1981 | Tanner | 714/762 |
| 6,539,367 B1 | * | 3/2003 | Blanksby et al. | 706/14 |
| 6,751,770 B1 | * | 6/2004 | Morelos-Zaragoza | 714/781 |
| 7,000,167 B1 | * | 2/2006 | Coker et al. | 714/752 |

* cited by examiner

*Primary Examiner*—Joseph Torres
(74) *Attorney, Agent, or Firm*—Roylance, Abrams, Berdo & Goodman, L.L.P.

(57) ABSTRACT

A forward error correction method for decoding coded bits generated by low density parity check matrixes. The method comprises converting each of the coded bits into a log likelihood ratio (LLR) value, and applying the converted values to variable nodes; delivering messages applied to the variable nodes to check nodes; checking a message having a minimum value among the messages, and determining a sign of the message having the minimum value; receiving messages updated in the check nodes, adding up signs of the received messages and a sign of an initial message, applying a weighting factor of 1 when all signs are identical, and when all signs are not identical, updating a message of a variable node by applying a weighting factor; determining LLR of an initial input value; and hard-deciding values of the variable nodes, performing parity check on the hard decision values, and stopping the decoding when no error occurs.

14 Claims, 12 Drawing Sheets

FORWARD ERROR CORRECTION APPARATUS AND METHOD IN A HIGH-SPEED DATA TRANSMISSION SYSTEM

PRIORITY

This application claims priority under 35 U.S.C. § 119 to an application entitled "Forward Error Correction Apparatus and Method in a High-Speed Data Transmission System" filed in the Korean Intellectual Property Office on Jun. 11, 2002 and assigned Serial No. 2002-32690, the contents of which are incorporated herein by reference.

BACKGROUND OF THE INVENTION

1. Field of the Invention

The present invention relates generally to a forward error correction apparatus and method in a digital communication system, and in particular, to a forward error correction apparatus and method in a digital communication system for high-speed data transmission.

2. Description of the Related Art

Generally, in a digital communication system, errors occur due to the noise generated in a transmission link, and various error correction techniques are used to correct the errors. In a wireless communication system adopting the 3GPP ($3^{rd}$ Generation Partnership Project) or 3GPP2 ($3^{rd}$ Generation Partnership Project 2) standard, use of a convolutional code has been proposed for transmission of voice and control signals, and use of a turbo code has been proposed for effective transmission of high-speed data. Of the codes stated above, the turbo code for transmission of high-speed data is advantageous in that it has a very low bit error rate (BER) at a low signal-to-noise ratio (SNR). However, the turbo code has several shortcomings in terms of its performance and implementation, discussed below.

First, the turbo code has a relatively short minimum distance. Therefore, during decoding of a signal coded with the turbo code, an error floor phenomenon may occur at a desired bit error rate. In addition, undetected error probability for a codeword in which an error has occurred during decoding is relatively high.

Second, in the decoding process of the turbo code, efficient decoding stop is needed to reduce decoding time and power consumption during the decoding process. Therefore, in order to provide an efficient decoding stop, a CRC (Cyclic Redundancy Code) check process for error detection at each iterative decoding, or an additional algorithm for the decoding stop is required.

Third, an algorithm for decoding the turbo code cannot be realized in a parallel architecture, so there are limitations in increasing the decoding rate.

Recently, a low density parity check code (hereinafter referred to as "LDPC code") has attracted public attention as a code that is similar or superior to the turbo code in performance, and can resolve the above problems. The LDPC code has a very small number of '1's in each row and column of a parity check matrix defining a code, and its structure can be defined by a factor graph consisting of a check node, a variable node, and an edge connecting the nodes. The LDPC code has a longer minimum distance than a turbo code with the same length. Therefore, it is generally known by those skilled in the art that in the LDPC code, compared with the turbo code, an error floor occurs at a very low bit error rate and the undetected error probability for a defective codeword is very low; experimentally, it has been shown to be close to zero. In addition, the LDPC can be implemented in a parallel architecture, contributing to a drastic reduction in decoding time, and can enable efficient decoding stop through parity check performed at each iterative decoding without some overhead, such as an additionally added CRC or a decoding stop algorithm.

The decoding process of the LDPC code is performed by iterative decoding based on a "sum-product" algorithm. An optimum sum-product algorithm includes a somewhat complicated arithmetic expression. Therefore, when the sum-product algorithm is used, a large amount of calculation is required in the decoding process. Accordingly, the use of the sum-product algorithm undesirably increases hardware complexity.

Therefore, when the LDPC code is used, there is necessity to further simplify the optimum decoding algorithm in an actual implementation. In order to minimize performance degradation due to the simplified algorithm, a weighting factor is applied to extrinsic information generated in the decoding process.

A detailed description will first be made of the LDPC code. The LDPC code can be defined by a factor graph. The factor graph consists of a check node indicating a parity check expression of a predetermined LDPC code, a variable node indicating each code symbol, and an edge indicating dependency between the nodes. The edge connects each check node to a variable node corresponding to a code symbol included in the parity check expression indicated by the check node. If the number of variable nodes connected to all check nodes is fixed to $d_c$ and the number of check nodes connected to all variable nodes is fixed to $d_v$, a corresponding LDPC code is called "regular LDPC code." In addition, if the number of edges connected to each check node and variable node is not constant, the corresponding LDPC code is referred to as "irregular LDPC code." Herein, only the regular LDPC code will be considered.

A process of decoding the LDPC code is performed by iterating a process in which a variable node and a check node on a factor graph exchange messages generated and updated for each node. In this case, each node updates a message by using a sum-product algorithm. A sum-product algorithm defined using a log likelihood ratio (hereinafter referred to as "LLR") for decoding of the LDPC code, and an LDPC code iterative decoding process based on the sum-product algorithm will be described herein below.

First, initialization (j=0) is performed as follows. An initial message of a variable node n is defined as the channel reliability of an $n^{th}$ symbol of a received codeword, and this is shown by $$q_{mn}^{(0)} = l_n^{(0)} = \ln(p_0/p_1) \qquad \text{Equation (1)}$$

In Equation (1), $$q_{mn}^{(0)}$$

is an initial value of an initially defined variable node message, and $$l_n^{(0)}$$

is an initial LLR value for the initially defined variable node. In addition, $P_0$ and $P_1$ are transmission link transition probabilities for a symbol '0' and a symbol '1', respectively.

After the initialization process, iterative decoding must be carried out. A description will now be made of iterative decoding at $j^{th}$ iteration. At the $j^{th}$ iteration, a check node message is updated (check node message update process). That is, the check node message becomes a message transmitted from a check node n to a variable node n. This can be expressed by $$r_{mn}^{(j)} = \ln\left(\frac{1 + \prod_{i=1}^{d_c-1} \tanh(q_i^{(j)}/2)}{1 - \prod_{i=1}^{d_c-1} \tanh(q_i^{(j)}/2)}\right) \quad \text{Equation (2)}$$

In Equation (2), $$r_{mn}^{(j)}$$

is a value obtained in a $j^{th}$ iterative decoding process in an iterative decoding process, and represents a message transmitted from a check node m to a variable node n. In addition, $$q_i^{(j)}$$

represents a message transmitted from a variable node i to a check node m in a $j^{th}$ iterative decoding process. Here, i indicates a value determined by rearranging variable nodes connected to a check node m from 0 to $d_c-1$. Therefore, when i=0, it means a variable node n.

When a variable node is updated by Equation (2), the variable node transmits a new message to a check node. The transmitted message becomes a message transmitted from a variable node n to a check node m, and this can be expressed by $$q_{mn}^{(j+1)} = q_{mn}^{(0)} + \sum_{i=1}^{d_v-1} r_i^{(j)} \quad \text{Equation (3)}$$

In Equation (3), $$q_{mn}^{(j+1)}$$

is a value obtained in a $j^{th}$ iterative decoding process, and represents a message transmitted from a variable node n to a check node m. At this point, $$r_i^{(j)}$$

represents a message transmitted from a check node i to a variable node n in a $j^{th}$ iterative decoding process, and i indicates a value determined by rearranging check nodes connected to a variable node n from 0 to $d_c-1$. Therefore, when i=0, it means a check node m.

After initialization is carried out as illustrated in Equation (1) to Equation (3), the LLR update is performed through a process of exchanging messages between a check node and a variable node after an iterative decoding process. The LLR update is achieved by $$l_n^{(j+1)} = l_n^{(0)} + \sum_{i=1}^{d_v-1} r_i^{(j)} \quad \text{Equation (4)}$$

In Equation (4), $$l_n^{(j+1)}$$

indicates an LLR value defined for a variable node n in a $j^{th}$ iterative decoding process.

After the LLR update is carried out by Equation (4), a decision process is performed. The decision process is achieved according to an LLR update result calculated by Equation (4), and is performed for all code symbols. A method for performing the decision process can be represented by If $l_n \geq 0$, $\hat{x}_n=0$ and else, $\hat{x}_n=1$ \quad Equation (5)

In Equation (5), $l_n$ is an LLR value defined for a variable node n at a particular decoding time. That is, $l_n$ is equivalent to $$l_n^{(j+1)}$$

of Equation (4), and $\hat{x}_n$ represent a codeword symbol estimated through a decoding process.

After the decision process is performed as shown by Equation (5), if a decoded codeword satisfies all parity check expressions, iteration is stopped. However, if the decoded codeword fails to satisfy all parity check expressions, the j value is increased by 1 and then, the process of Equation (2) to Equation (5) is iterated. Such iteration can be performed as many times as a predetermined iteration number. Even after the iteration is performed as many times as a predetermined maximum iteration number, if the codeword fails to satisfy all parity check expressions, the decoding is stopped and then, decoding failure is declared.

In the foregoing description, a sum-product algorithm used by each node in the message update process is called "optimum sum-product algorithm." The optimum sum-product algorithm can be simply derived through a theoretical calculation process without a certain approximation process.

However, the check node message update process shown by Equation (2) can be simplified as shown in Equation (6) below, for approximation.

$$r_{mn}^{(j)} = CHK(q_1, q_2, \ldots, q_{d_c-1}) = CHK(q_1 CHK(q_2, \ldots, q_{d_c-1}))$$

$$CHK(q_x, q_y) = \ln\left(\frac{1+\tanh(q_x/2)\tanh(q_y/2)}{1-\tanh(q_x/2)\tanh(q_y/2)}\right)$$

$$\approx \mathrm{sgn}(q_x)\mathrm{sgn}(q_y)\min(|q_x|, |q_y|) + c \ (c: \text{correction factor})$$

$$c = \begin{cases} -0.5 & \text{if } (|q_x+q_y| > 2|q_x-q_y|) \text{ and } |q_x-q_y| < 2 \\ 0.5 & \text{if } (|q_x-q_y| > 2|q_x+q_y|) \text{ and } |q_x+q_y| < 2 \\ 0 & \text{otherwise} \end{cases}$$

Equation (6)

In Equation (6), $q_x$ and $q_y$ represent variable node messages applied to the check node. In addition, sgn(x) is a function having a value of 1 for x>0 and a value of −1 for x<0.

Equation (6) shows an optimum sum-product algorithm in which a check node message update process is simplified through an approximation process. For a message updated in a particular check node m, signs of variable node messages on two particular edges are multiplied by each other, and then, the result is used as a sign of a temporary result message. In addition, when compared to the absolute values of the variable node messages, a smaller value is selected and defined as a size of the temporary result message. In order to correct an error caused by the approximation process, the temporary result message is updated by adding a correction factor c determined by a predetermined rule to the temporary result message. Further, a check node message is finally updated by iteratively applying such a process to other edges connected to a check node m except the edges connected to a variable node n. A sum-product algorithm using this is called 'sum-product algorithm with correction factor'. The approximated LDPC code iterative decoding, based on the 'sum-product algorithm with correction factor', shows superior performance with regards to the decoding performance that can be obtained by an optimum sum-product algorithm, without performing the somewhat complicated calculation of tanh( ) in a check node message update process in an LDPC code decoding process based on the optimum sum-product algorithm.

The optimum sum-product algorithm, as can be noted from Equation (2), must perform calculation of tanh( ) function for each of check node messages applied to a check node in order to update a check node message at a particular iterative decoding time. This increases complexity during hardware implementation due to the complicated calculation of tanh( ) function. In order to solve these problems, there has been proposed an algorithm for simplifying a check node message update process through an approximation process and applying a correction factor to the approximation process to minimize performance degradation due to the approximation process. However, the 'sum-product algorithm with correction factor' must determine a correction factor for all edges connected to a check node according to a variable node message delivered from the edges in order to finally update the check node message. Since such an operation must be performed on all edges in sequence, each check node undesirably requires a relatively large amount of calculation and a long calculation time.

SUMMARY OF THE INVENTION

It is, therefore, an object of the present invention to provide a simple decoding apparatus and method for an error correction code.

It is another object of the present invention to provide an LDPC decoding apparatus and method for simply performing a sum-product algorithm used.

It is further another object of the present invention to provide an LDPC decoding apparatus and method for reducing a calculation amount of each node when a sum-product algorithm is used.

It is still another object of the present invention to provide an apparatus and method for performing a sum-product algorithm, capable of reducing a calculation amount while maximally maintaining LDPC performance.

To achieve the above and other objects, the various embodiments of the invention provide a forward error correction method for decoding coded bits transmitted over a radio channel after being generated by encoding as many binary bits as the number of columns with low density parity check matrixes having rows and the columns. The method comprises the steps of: converting each of the coded bits into a log likelihood ratio (LLR) value indicating a ratio of probability of zero to probability of one, and applying the converted values to as many variable nodes as the number of elements of the row; delivering messages applied to the variable nodes to check nodes connected to the variable nodes; checking a message having a minimum value among the messages delivered from the variable nodes, and determining a sign of the message having the minimum value by calculating the product of signs of other messages except a message of a variable node that is to transmit the checked message; receiving, by the variable nodes, messages updated in the check nodes, adding up signs of the received messages and a sign of an initial message, applying a weighting factor of 1 when the signs are all identical, and when the signs are not all identical, updating a message of a variable node by applying a weighting factor having a predetermined value smaller than 1 to the sum of messages received from all other check nodes and adding a previous value to the result value; determining the LLR of an initial input value by using the updated value of the variable node; and hard-deciding values of the variable nodes, performing parity check on the hard decision values by using the low density parity code matrixes, and stopping the decoding when no error occurs as a result of the parity check.

Further, when an error occurs, if a current iteration number is smaller than or equal to a predetermined iteration number, the steps starting with the delivering step up to and including the parity check step are iteratively performed.

To achieve the above and other objects, the embodiments of the invention provide a forward error correction apparatus for decoding coded bits transmitted over a radio channel after being generated by encoding as many binary bits as the number of columns with low density parity check matrixes having rows and the columns. In the apparatus, a variable node message determiner converts each of the coded bits into a log likelihood ratio (LLR) value indicating a ratio of probability of zero to probability of one, applies the converted values to as many variable nodes as the number of elements of the row, receives updated messages from check nodes connected to the variable nodes, adds up signs of the received messages and a sign of an initial message, applies a weighting factor of 1 when the signs are all identical, and when the signs are not all identical, updates a message of a variable node by applying a weighting factor having a predetermined value smaller than 1 to the sum of messages received from all other check nodes and adding a previous value to the result value. A check node message determiner checks a message having a minimum value among messages delivered from the variable nodes, and determines a sign of a message having the minimum value by calculating the product of signs of other messages except a message of a variable node that is to transmit the checked message. An LLR determiner sums up messages received from the variable nodes, multiplies the summed value by a predetermined weighting factor, and determines an LLR value by using a value calculated by adding a channel reliability to the multiplied value. A hard decision device decodes an output value of the LLR determiner into a binary bit having a value of zero or one. A parity checker performs parity check on the hard decision value by using a low density parity check code, and stops decoding when no error occurs.

Further, when an error occurs, if a current iteration number is smaller than or equal to a predetermined iteration number, the decoding is iteratively performed.

BRIEF DESCRIPTION OF THE DRAWINGS

The above and other objects, features and advantages of the embodiments of the present invention will become more apparent from the following detailed description when taken in conjunction with the accompanying drawings in which.

DETAILED DESCRIPTION OF THE PREFERRED EMBODIMENT

Figure 1:
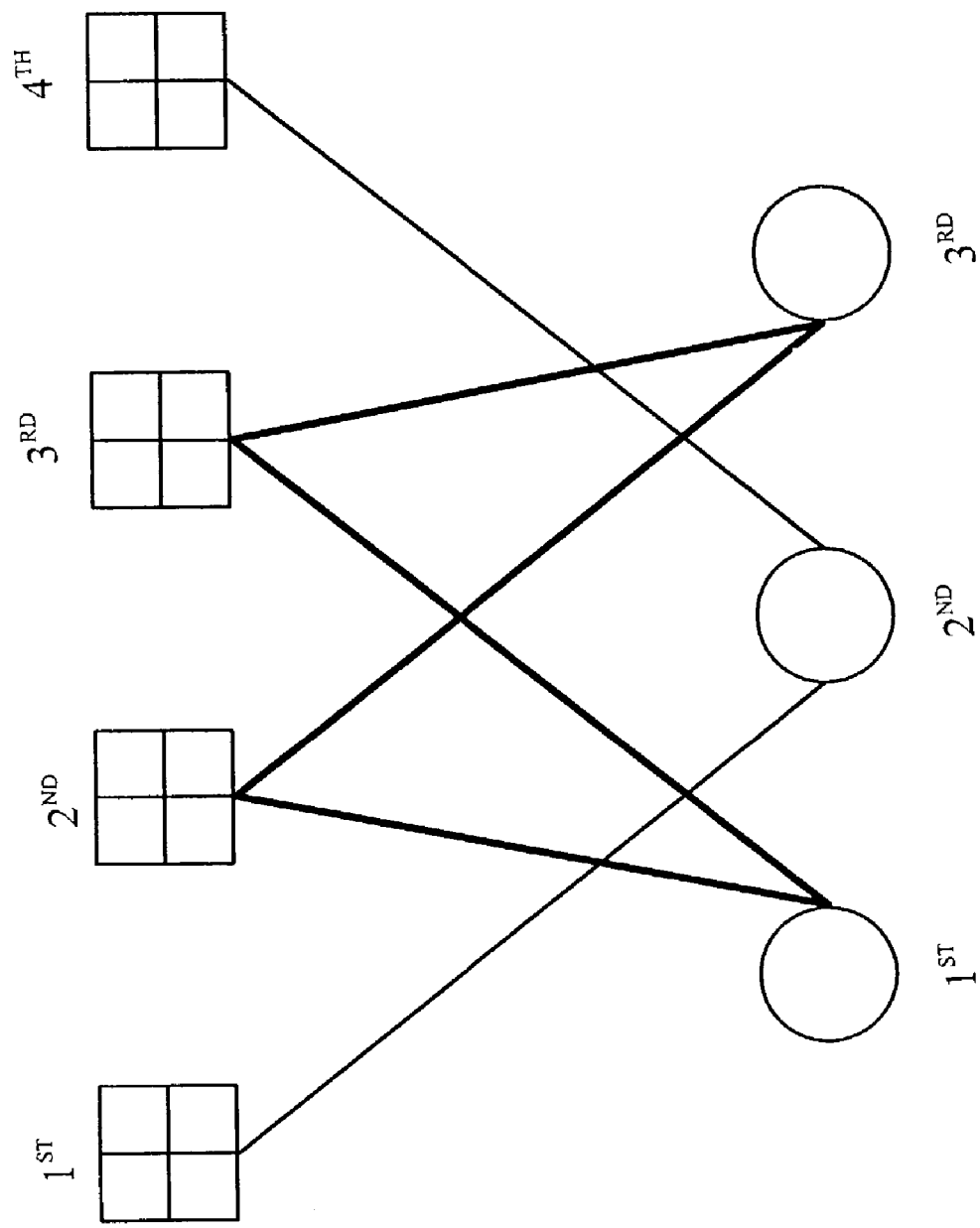
FIG. 1 illustrates an example of a short cycle having a length of 4.

Several embodiments of the present invention will now be described in detail with reference to the annexed drawings. In the drawings, the same or similar elements are denoted by the same reference numerals even though they are depicted in different drawings. In the following description, a detailed description of known functions and configurations incorporated herein has been omitted for conciseness.

The embodiments of the present invention modifies a sum-product algorithm used for LDPC code decoding. In the following description, a decoding algorithm for an LDPC code according to the embodiments of the present invention will be referred to as "modified sum-product algorithm."

In the modified sum-product algorithm according to the embodiments of the present invention, the check node message update process of Equation (2), described in conjunction with the prior art, is modified into $$r_{mn}^{(j)} \approx \left(\prod_{i=1}^{d_c-1} \mathrm{sgn}(q_i)\right) \min_i |q_i|, \, i = 1, 2, \ldots, d_c - 1 \qquad \text{Equation (7)}$$

Equation (7) is an expression where a correction factor is not considered in the check node message update process of the 'sum-product algorithm with correction factor'. If the check node message update process is modified as shown in Equation (7), the variable node message update process of Equation (3), described in conjunction with the prior art, is modified into $$q_{mn}^{(j+1)} = q_{mn}^{(0)} + \alpha_n^{(j)} \sum_{i=1}^{d_v-1} r_i^{(j)}, \qquad \text{Equation (8)}$$

$$\alpha_n^{(j)} = \begin{cases} 1.0 & \text{if } \left|\mathrm{sgn}(q_{mn}^{(0)}) + \sum_{i=0}^{d_v-1} \mathrm{sgn}(r_i^{(j)})\right| = d_v + 1 \\ f_g & \text{if } \left|\mathrm{sgn}(q_{mn}^{(0)}) + \sum_{i=0}^{d_v-1} \mathrm{sgn}(r_i^{(j)})\right| < d_v + 1 \end{cases}$$

In Equation (8), sgn(x) is a function indicating a sign of a value x. Herein, sgn(x)=1 for x>0, and sgn(x)=−1 for x<0. In addition, $d_v$ is the number of edges connected to a variable node n. In the invention, a regular LDPC code is considered in which the number of edges connected to all check nodes is identical to the number of edges connected to all variable nodes, so the $d_v$ is constant for all variable nodes. In addition, if a sign of a check node message applied to a variable node is identical to a sign of a channel reliability, Equation (8) does not consider a weighting factor. However, if any one of the signs is different, Equation (8) considers a weighting factor having a value smaller than 1. Here, the reason for considering a weighting factor smaller than 1 is to cancel out the influence of a check node message error generated through approximation of the check node message update process represented by Equation (7) and to cancel out the influence of self-information fed back due to a short cycle which may exist on a factor graph defining an LDPC code. Here, the "cycle" refers to a loop formed by several edges on a factor graph, and a cycle having a short length is called "short cycle." Generally, it is known by those skilled in the art, that a short cycle has a negative effect on decoding of a code symbol for a corresponding node since a message output from a particular variable node is updated through as many iterative decoding processes as ½ of a cycle length and then applied to a corresponding variable node. Such an example is illustrated in FIG. 1.

FIG. 1 illustrates an example of a short cycle having a length of 4. In FIG. 1, circles represent variable nodes, and blocks marked by a cross represent check nodes. Connections between the first variable node and second check node, the second check node and third variable node, the first variable node and third check node, and the third check node and third variable node are shown by bold lines, representing a short cycle.

In accordance with Equation (7) and Equation (8), the conventional LLR update process of Equation (4) is modified into $$l_n^{(j+1)} = l_n^{(0)} + \alpha_n^{(j)} \sum_{i=0}^{d_v-1} r_i^{(j)} \qquad \text{Equation (9)}$$

Performance improvement can be expected by canceling out the influence of self-information due to a possible short cycle, through the weighting factor of Equation (8) and Equation (9).

Since a check node message and channel reliability applied to a particular variable node represent the probability that the corresponding variable node would have a value of "0" or "1," if signs thereof are not identical, it can be considered that an error has occurred in a transmission link or in a decoding process. In this case, therefore, it can be judged that a variable node message or LLR obtained through the messages has lower reliability than a variable message or LLR obtained when signs of all messages applied to the variable node are identical. Therefore, if signs of all messages applied to a variable node are not identical, the corresponding variable mode message and LLR value are multiplied by a weighting factor smaller than 1. The value of the weighting factor can be set to an appropriate value through experiment.

In the following description, a modified sum-product algorithm considering an adaptive weighting factor is referred to as a 'modified sum-product algorithm with weighting factor'.

Figure 2:
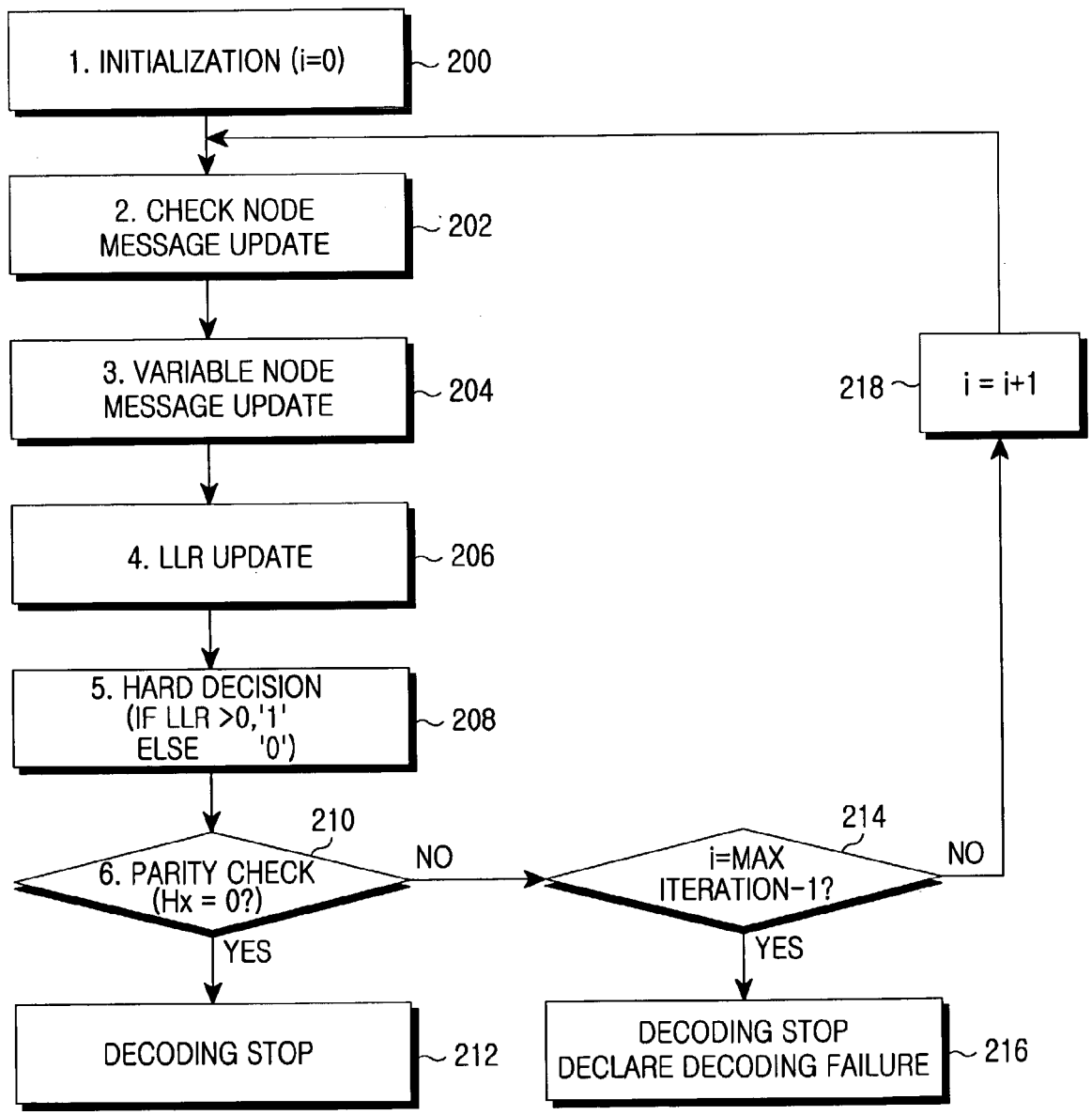
FIG. 2 is a flow chart illustrating a 'modified sum-product algorithm with weighting factor' for iterative decoding of an LDPC code according to an embodiment of the present invention.

FIG. 2 is a flow chart illustrating a 'modified sum-product algorithm with weighting factor' for iterative decoding of an LDPC code according to an embodiment of the present invention. With reference to FIG. 2, a description will now be made of a 'modified sum-product algorithm with weighting factor' for iterative decoding of an LDPC code according to an embodiment of the present invention.

In step 200, an initialization process is performed. In the initialization process, an initial value of a variable node message on a factor graph representing an LDPC code structure is set. The initial value of the variable node message is defined as a channel reliability for a received code symbol corresponding to the variable node. Since the 'modified sum-product algorithm with weighting factor' performs its calculations in an LLR domain, the channel reliability is determined by multiplying a received symbol by a signal-to-noise ratio (SNR). Accordingly, message initialization is performed on all variable nodes on the factor graph.

After the initialization process, a check node message update process is performed in step 202. In the check node message update process, a check node message is updated by using Equation (7). In the update process of a check node message output to a variable node n, signs of all input messages except an input from a variable node n among messages applied to a check node are multiplied and then defined as a sign of an output message. In addition, a minimum value is selected among absolute values of the input messages, and defined as a size of the output message. In this way, message update is performed on all check nodes on the factor graph of FIG. 1.

After the check node message update process, a variable node message update process is performed in step 204. In the variable node message update process, a variable node message is updated by using Equation (8). In the update process of the variable node message output to a check node n, all input messages except an input from a check node m among messages applied to a variable node are multiplied by a weighting factor and then the result values are added. A channel reliability is added to this sum; the channel reliability has an initial value of the variable node message. If signs of all messages applied to a variable node and a sign of the channel reliability are all identical, a weighting factor is 1. Otherwise, the weighting factor has a value smaller than 1. Even in the variable node message update process of step 204, message update is performed on all variable nodes on the factor graph of FIG. 1.

Thereafter, an LLR update is performed in step 206. In the LLR update process, an LLR value for a code symbol corresponding to a variable node is updated by using Equation (9). In the LLR update process, all messages applied to a variable node are multiplied by a weighting factor, and then, a value determined by summing up the result values is added to a channel reliability (which is an initial value of a variable node message). At this point, the value of the weighting factor is determined in the manner described in conjunction with step 204. Even in the LLR update process, LLR update is performed on all code symbols on the factor graph.

Thereafter, a hard decision process is performed in step 208. In the hard decision process, if an LLR value in a particular symbol of an LDPC code is larger than 0, a binary value '0' is decoded, and otherwise, if the LLR value is smaller than 0, a binary value '1' is decoded. The decoded values are stored. A decoded codeword is obtained by performing a hard decision on all code symbols constituting one LDPC codeword. After performing the hard decision, the algorithm proceeds to step 210.

Steps 210 and 214 provide a process of determining whether an error has occurred, through parity check. When hard decision for all code symbols of the LDPC code is completed, one codeword can be obtained from the hard decision results. When all parity check expressions defined by a parity check matrix are applied to the obtained codeword, decoding is stopped in step 212 if no error is detected in step 210 ("Yes" path from decision step 210). Further, the corresponding codeword is stored as a decoded codeword. In contrast, if an error is detected as a result of the parity check in step 210 ("No" path from decision step 210), the algorithm determines in step 214 whether decoding has been performed as many times as a predetermined maximum iteration number. If the decoding has not been performed as many times as the predetermined iteration number ("No" path from decision step 214), the algorithm increases a current iteration number by 1 in step 218, and then proceeds to step 202 to continuously perform the iterative decoding. However, if an error is continuously detected even after the iterative decoding has been performed as many times as the predetermined iteration number in step 214 ("Yes" path from decision step 214), the algorithm stops the decoding in step 216. Further, the algorithm declares the decoding failure and discards the corresponding codeword.

Figure 3A:
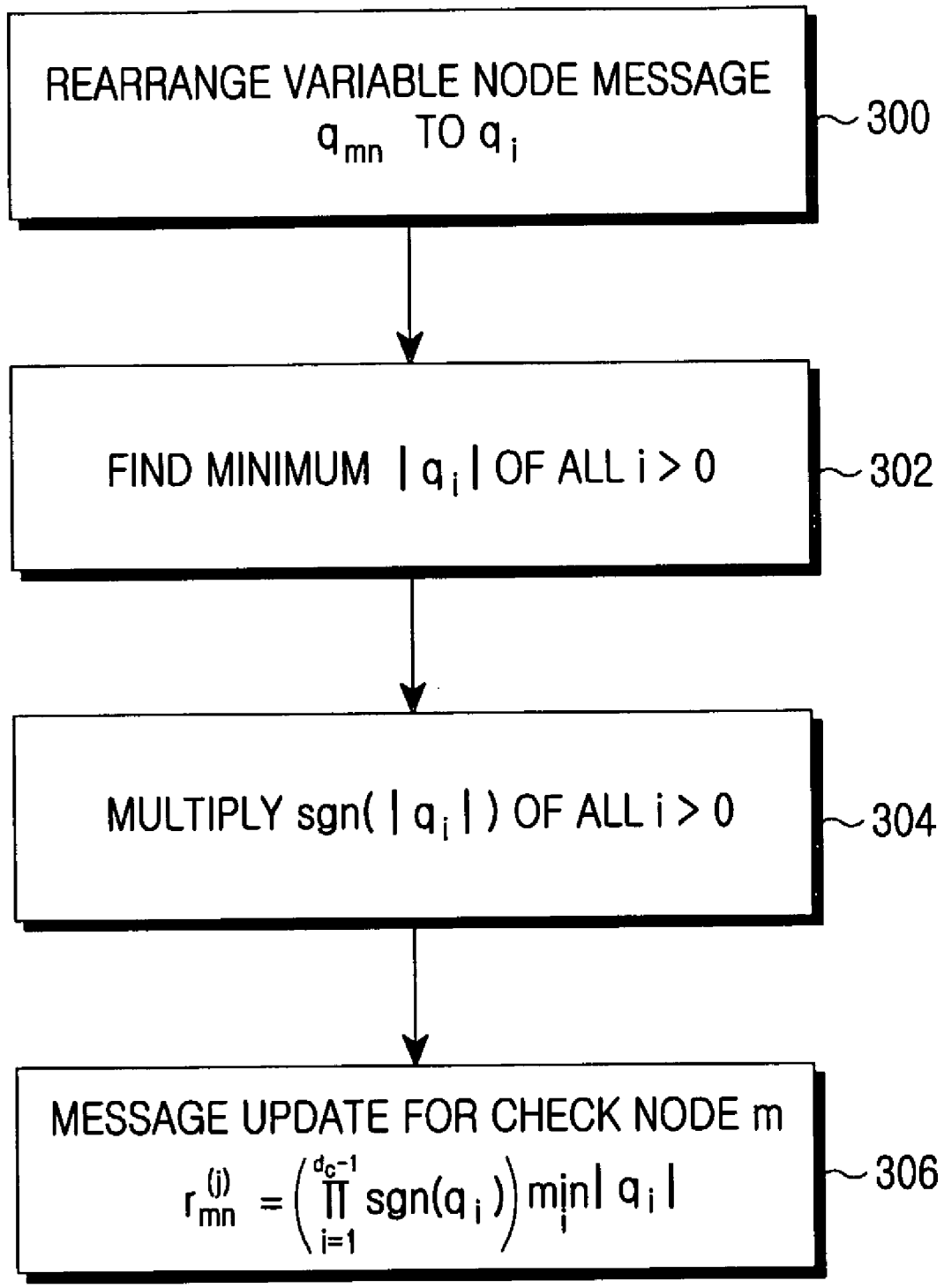
FIG. 3A is a flow chart illustrating a process of updating a message in a particular check node according to an embodiment of the present invention.

FIG. 3A is a flow chart illustrating a process of updating a message in a particular check node according to an embodiment of the present invention. With reference FIG. 3A, a detailed description will now be made of a procedure for updating a message in a particular check node.

In step 300, messages applied from a particular variable node to a particular check node are rearranged. An index of a message received from a variable node n among the messages applied to a particular check node m is assigned as an initial index (i=0) of a new message index i. In step 302, absolute values of all messages except a message with a message index i=0 among the messages applied to a check node, are compared, and then a minimum value is selected from the compared values. In step 304, signs of all messages except a message with a message index i=0 among the messages applied to a check node are multiplied. Thereafter, in step 306, the minimum value selected in step 302 from the message absolute values is multiplied by the message sign calculated in step 304 to determine a final message transmitted from a particular check node m to a particular variable node n. Therefore, FIG. 3A illustrates a process of calculating Equation (7).

Figure 3B:
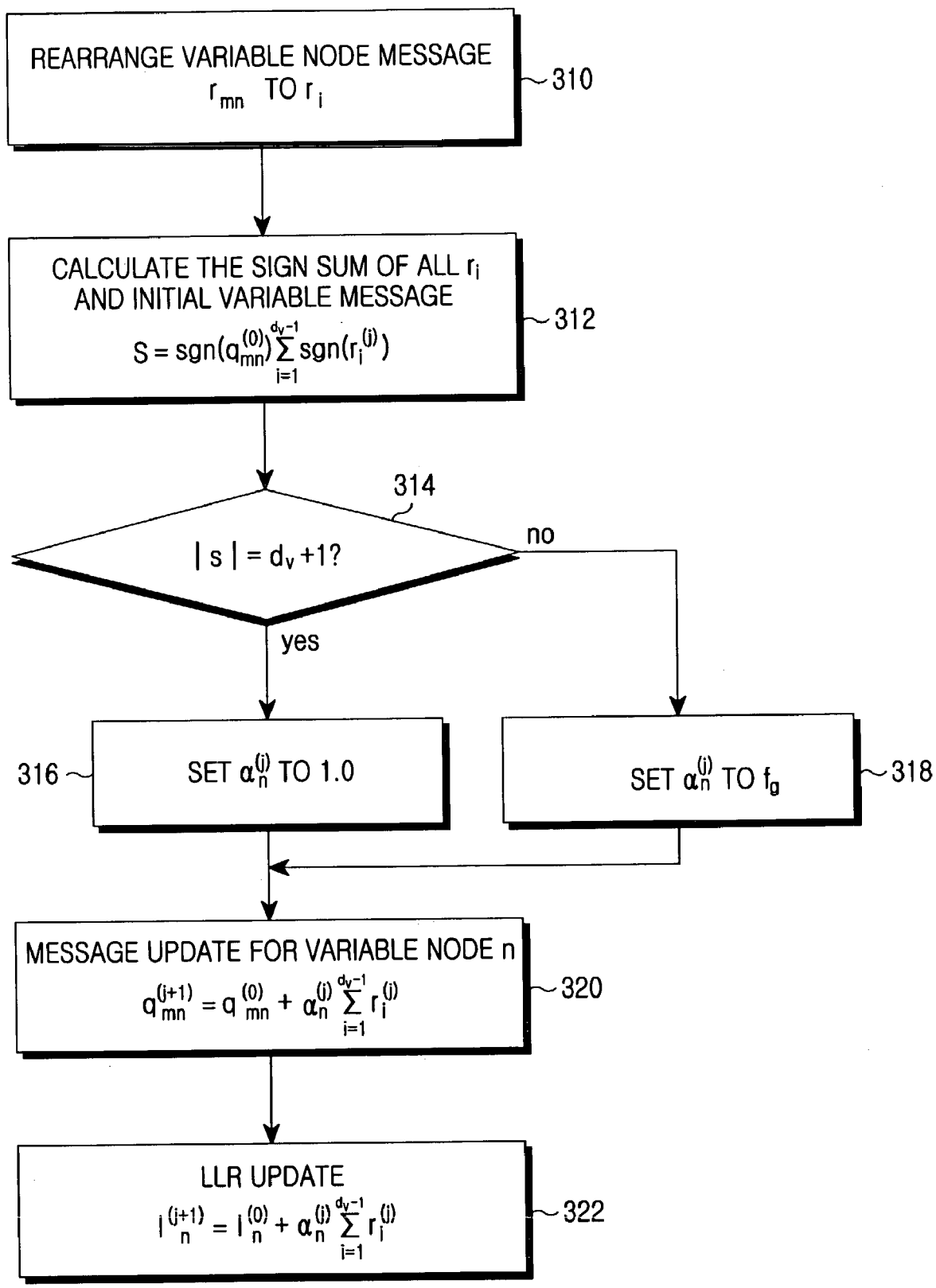
FIG. 3B is a flow chart illustrating a process of updating a message in a variable node connected to the check node that performs the process of FIG. 3A, according to an embodiment of the present invention.

FIG. 3B is a flow chart illustrating a process of updating a message in a variable node connected to the check node that performs the process of FIG. 3A, according to an embodiment of the present invention. With reference to FIGS. 3A and 3B, a detailed description will be made of a process of updating a message in a variable node connected to a particular check node according to an embodiment of the present invention.

In step 310, messages applied from a particular check node to a particular variable node are rearranged. An index of a message received from a check node m among the messages applied to a particular variable node n is assigned as an initial index (i=0) of a new message index i. Thereafter, in step 312, a particular variable s is calculated by summing up signs of all messages applied to a particular variable node and a sign of an initial message value for the variable node. Thereafter, in step 314, an absolute value of the particular variable s calculated in step 312 is compared with a value determined by adding 1 to the number of all messages applied to the variable node. If the absolute value of the variable s is identical to the value determined by adding 1 to the number of messages applied to the variable node as a result of the comparison ("Yes" path from decision step 314), the process proceeds to step 316, and otherwise, the process proceeds to step 318 ("No" path from decision step 314). The determination of step 314 of whether the absolute value of the s is identical to the value determined by adding 1 to the number of messages applied to the variable node, is equivalent to determining whether signs of all messages received from the variable node and an initial value of a variable node message are all identical. If signs of all messages received from the variable node and an initial value of the variable node message are all identical as a result of the comparison, a value of a weighting factor for the variable node is set to 1 in step 316 ("Yes" path from decision step 314). In contrast, if the absolute value of the s is not identical to the value determined by adding 1 to the number of messages applied to the variable node (No" path from decision step 314), i.e., if any one of signs of all messages applied to the variable node and an initial value of the variable node message is different, then the value of a weighting factor for the variable node is set to a value smaller than a predetermined value 1 in step 318. After step 316 or 318, step 320 is performed. In step 320, a message transmitted from a particular variable node n to a particular check node m is determined by using the weighting factor calculated in step 316 or 318, the initial message for the particular variable node, and the sum of all messages except a message with a message index i=0 among the check node messages applied to the particular variable node. Thereafter, in step 322, an LLR message for a particular variable node n is calculated by using the weighting factor calculated in step 316 or 318, an initial LLR value for the particular variable node, and the sum of all check node messages applied to the particular variable node.

Figure 4A:
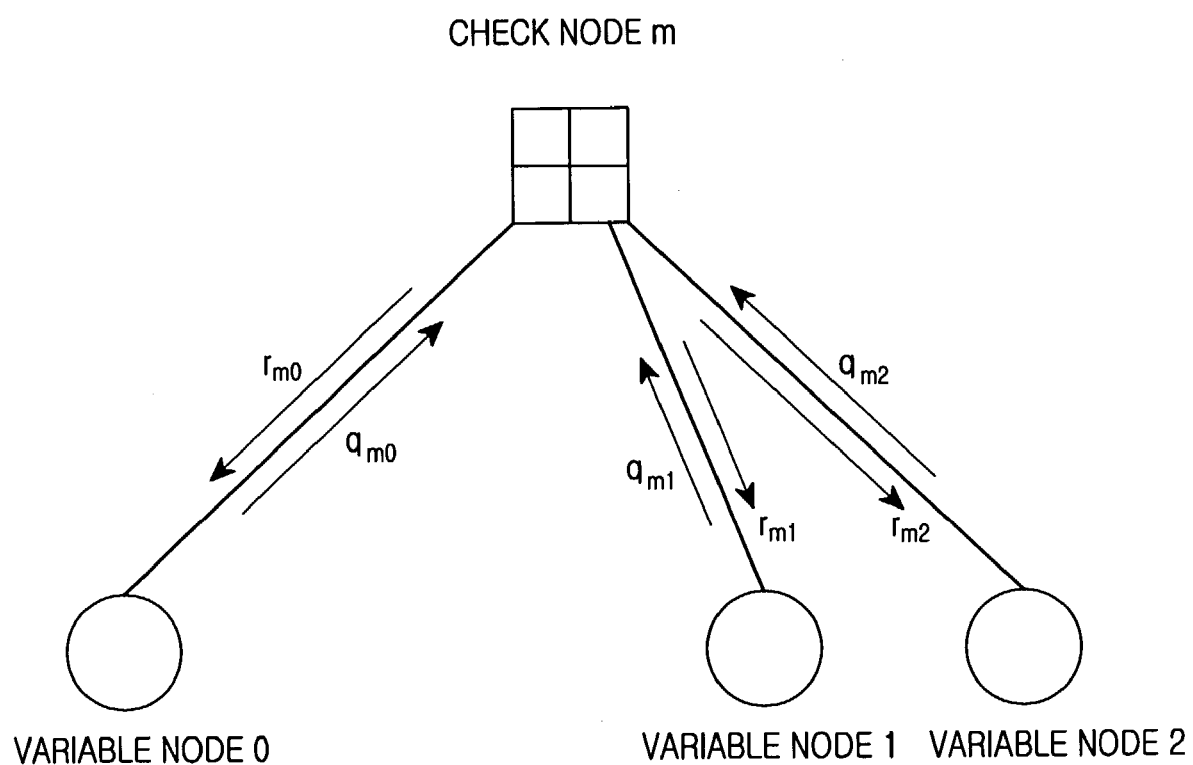
FIG. 4A illustrates signal flow during check node update according an embodiment of the present invention.
Figure 4B:
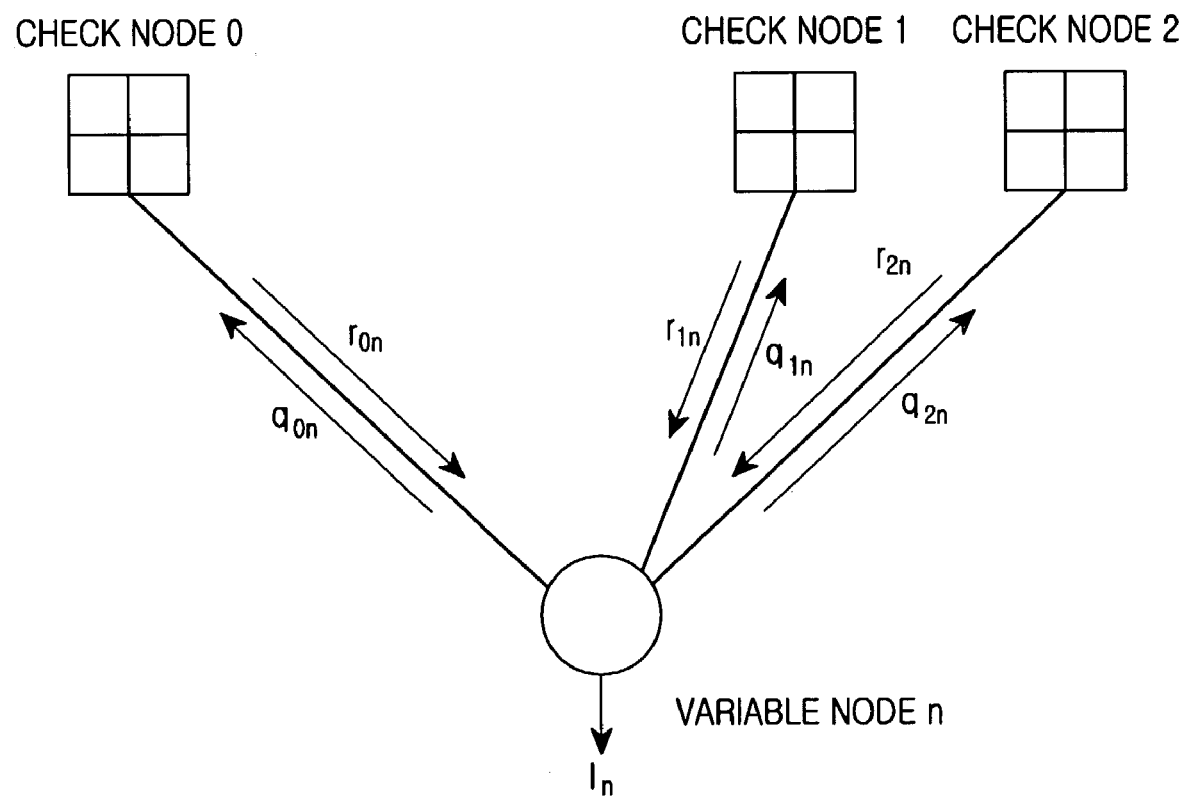
FIG. 4B illustrates signal flow during variable node and LLR update according to an embodiment of the present invention.

A description will now be made of an exemplary structure of a processor for updating a message in each node according to an embodiment of the present invention. For simplicity, it will be assumed herein that the number of edges connected to check nodes and the number of edges connected to variable nodes are both 3, though one skilled in the art can appreciate that this need not be the case). A message update process in a particular check node m and a message update process in a particular variable node n are illustrated in FIGS. 4A and 4B, respectively. In addition, a processor for each node in the message update process of FIG. 4A and a processor for each node in the message update process of FIG. 4B are illustrated in FIGS. 5A and 5B, respectively.

Figure 5A:
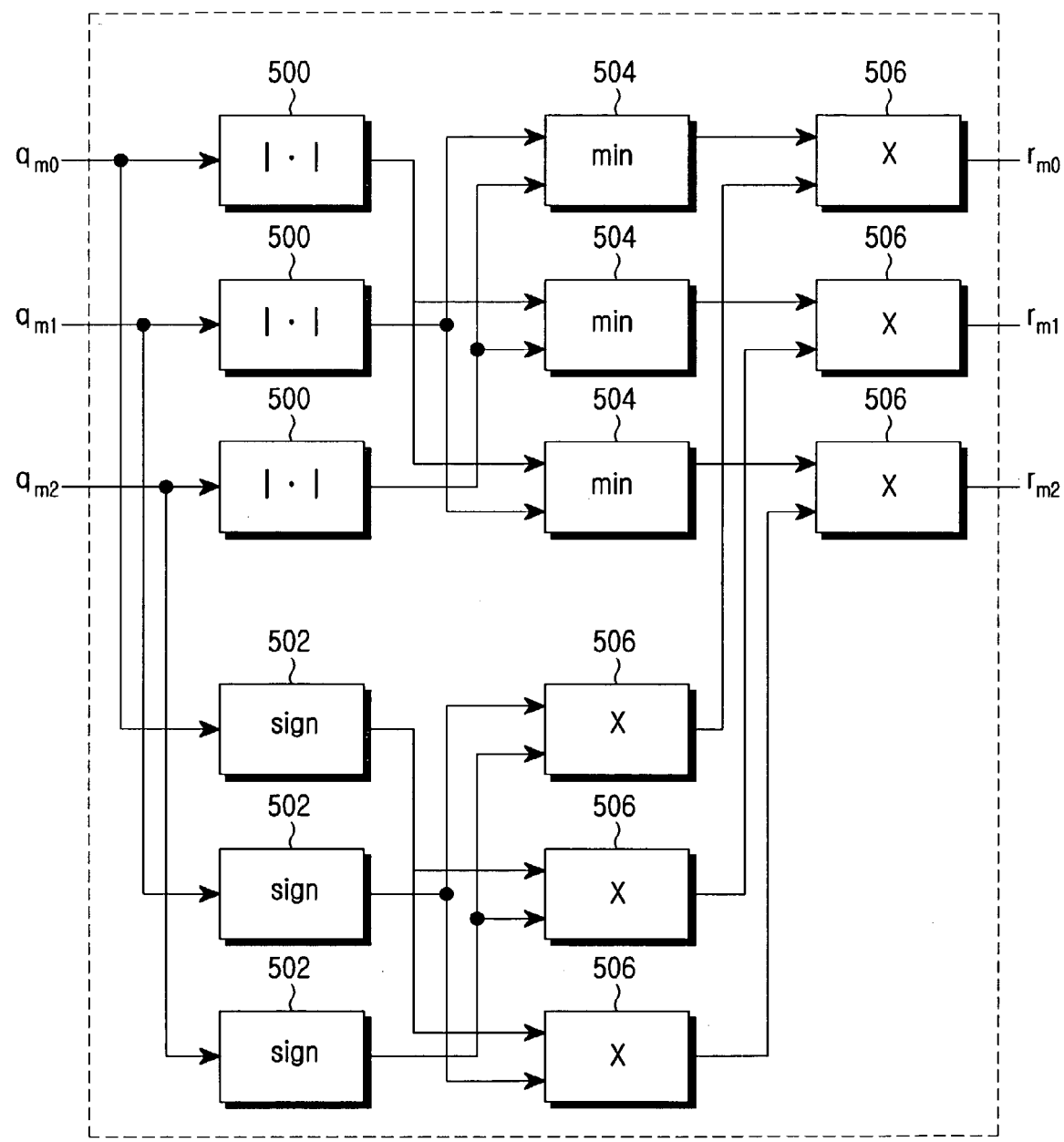
FIG. 5A is a block diagram of a check node processor for the signal flow of FIG. 4A according to an embodiment of the present invention.
Figure 5B:
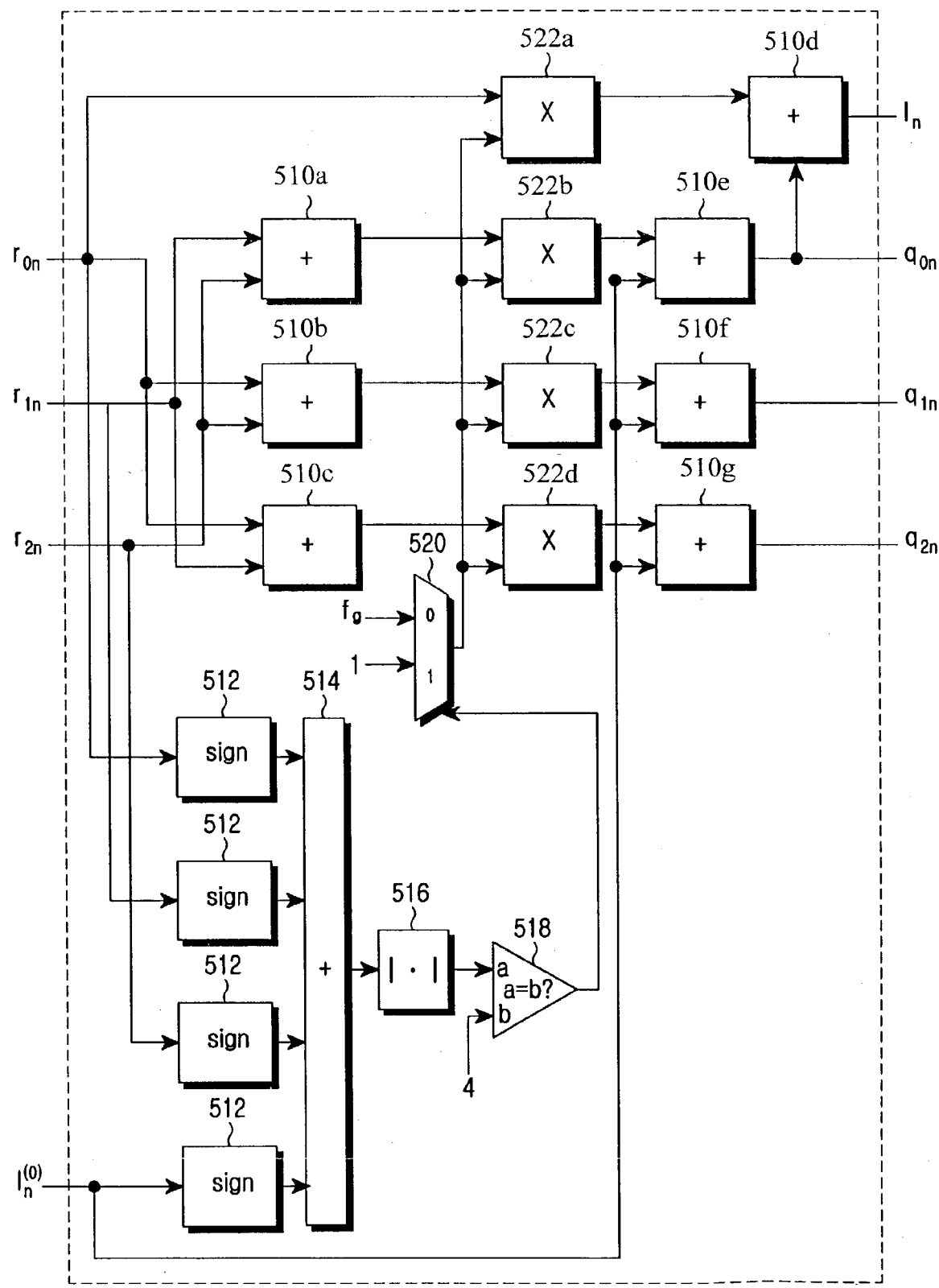
FIG. 5B is a block diagram of a variable node and LLR update processor for the signal flow of FIG. 4B according to an embodiment of the present invention.

In FIGS. 5A and 5B, since it is assumed that the number of edges connected to corresponding nodes is fixed to 3, the numbers of input ports and output ports of a check node processor are both 3, and the numbers of input ports and output ports of a variable node processor are both 4 by considering LLR. For an actual regular LDPC code, the number of input/output ports of each node processor is determined according to $d_v$ and $d_c$, the number of input edges of each node. An internal structure of the processor is so designed as to realize the 'modified sum-product algorithm with weighting factor' proposed by an embodiment of the present invention.

FIG. 5A illustrates an example of a hardware device that realizes Equation (7) for calculating check node messages by handling input variable node messages. In FIG. 5A, absolute value calculators 500 each calculate an absolute value of a corresponding input variable node message. Input variable calculators 502 each calculate a sign of the corresponding input variable node message. The absolute values calculated by the absolute value calculators 500 are provided to minimum value selectors 504, and the minimum value selectors 504 each select a minimum value from their two inputs. Multipliers 506 each multiply their two inputs by each other. Specifically, output values of the input variable calculators 502 are provided in pairs to the three lower multipliers 506. Here, the reason that the number of the lower multipliers 506 each calculating a pair of output values of the input variable calculators 502 is 3 is because the number of edges connected to the check nodes is 3. Output signals of the three lower multipliers 506, each of which multiplies a pair of the output values of the input variable calculators 502, and output signals of the minimum value selectors 504 are provided to the three upper multipliers 506. The three upper multipliers 506 generate output values $rm_0$, $rm_1$ and $rm_2$ to be transmitted to corresponding variable nodes, by multiplying their two inputs.

FIG. 5B illustrates an example of a hardware device that realizes Equation (8) and Equation (9) for calculating variable node messages and a new LLR message by handling input check node messages and an input LLR message. In FIG. 5B, three front adders 510 each add a pair of inputs from check nodes. Four sign detectors 512 each calculate a sign of an LLR value according to a corresponding input check node message or an initially received channel reliability. Outputs of the sign detectors 512 are provided to an adder 514, and the adder 514 adds up the signals provided from the sign detectors 512. A value calculated by the adder 514 is provided to an absolute value calculator 516. The absolute value calculator 516 then calculates an absolute value of the provided value. A comparator 518 compares an output of the absolute value calculator 516 with a fixed input value. The comparator 518 outputs a value of '1' if the two input values are identical to each other, and otherwise, the comparator 518 outputs a value of '0'. An output value of the comparator 518 is provided to a selector 520 as a control signal. The selector 520 selects one of its two inputs (1 and $f_g$) according a value (0 or 1) of the control signal from the comparator 518. The four multipliers 522*a*–*d* can be divided into two groups. A first group includes multipliers receiving outputs of the three adders 510*a*–*c* (i.e., multipliers 522*b*–*d*) each of which adds a pair of values received from the check nodes, and a second group includes a multiplier 522*a* receiving a signal received from a first check node among the check nodes. There are provided a total of four multipliers. The four multipliers 522*a*–*d* all receive an output of the selector 520 at their second input terminals. Each of the multipliers 522*a*–*d* multiplies their two input signals. The output values of the multipliers 522*a*–*d* are provided to rear adders 510*d*–*g*. The number of the rear adders 510*d*–*g* is also 4, and each read adder 510*d*–*g* adds different values. Specifically, of the four rear adders 510*d*–*g*, three rear adders (510*e*–*g*) receive outputs of the three front adders 510*a*–*c* (through multipliers 522*b*–*d*) at their first input terminals, and commonly receive an initial value defined as a channel reliability of a received codeword at their second input terminals ($I^{(0)}_N$). The three rear adders 510*e*–*g* each add their input values. The other rear adder 510*d* receives an output of the second-group multiplier 522*a* at its first input terminal and receives a signal output to the first check node at its second input terminal. Thus, the other rear adder generates a value for determining an LLR value by adding the output of the corresponding multiplier to the signal output to the first check node.

A description will now be made of the simulation result of LDPC code decoding. The simulation was divided into simulation for an LDPC code having a short length and simulation for an LDPC code having a long length.

First, the simulation for the LDPC code having a short length will be described. The simulation environment is given as follow.

(1) A regular LDPC code is used in which the number of edges connected to a check node is fixed to 6 and the number of edges connected to a variable node is 3 on the factor graph. In addition, a short cycle having a length shorter than 6 is removed in the factor graph generation process.

(2) The number of check nodes is 256, and the number of variable nodes is 504.

(3) In the simulation, it is assumed that information bits constituting an LDPC code are all '0's. Therefore, symbols of a transmission LDPC codeword are also all '0's. Since the LDPC code is a linear code, the result obtained by the simulation does not lose generality.

(4) BPSK (Binary Phase Shift Keying) demodulation scheme and channel environment are assumed as an AWGN (Additive White Gaussian Noise) transmission link.

(5) It is assumed that a codeword completely decoded without arriving at the maximum iteration number has no error. The undetected error probability is, therefore, 0.

(6) A weighting factor $f_g$ smaller than 1 in the variable node message update process is set to 0.8 ($f_g$=0.8).

(7) A decoding performance criterion is set at a word error rate (WER) for energy per information bit (Eb/No).

(8) The maximum iteration number is set to 50 or 200.

Figure 6:
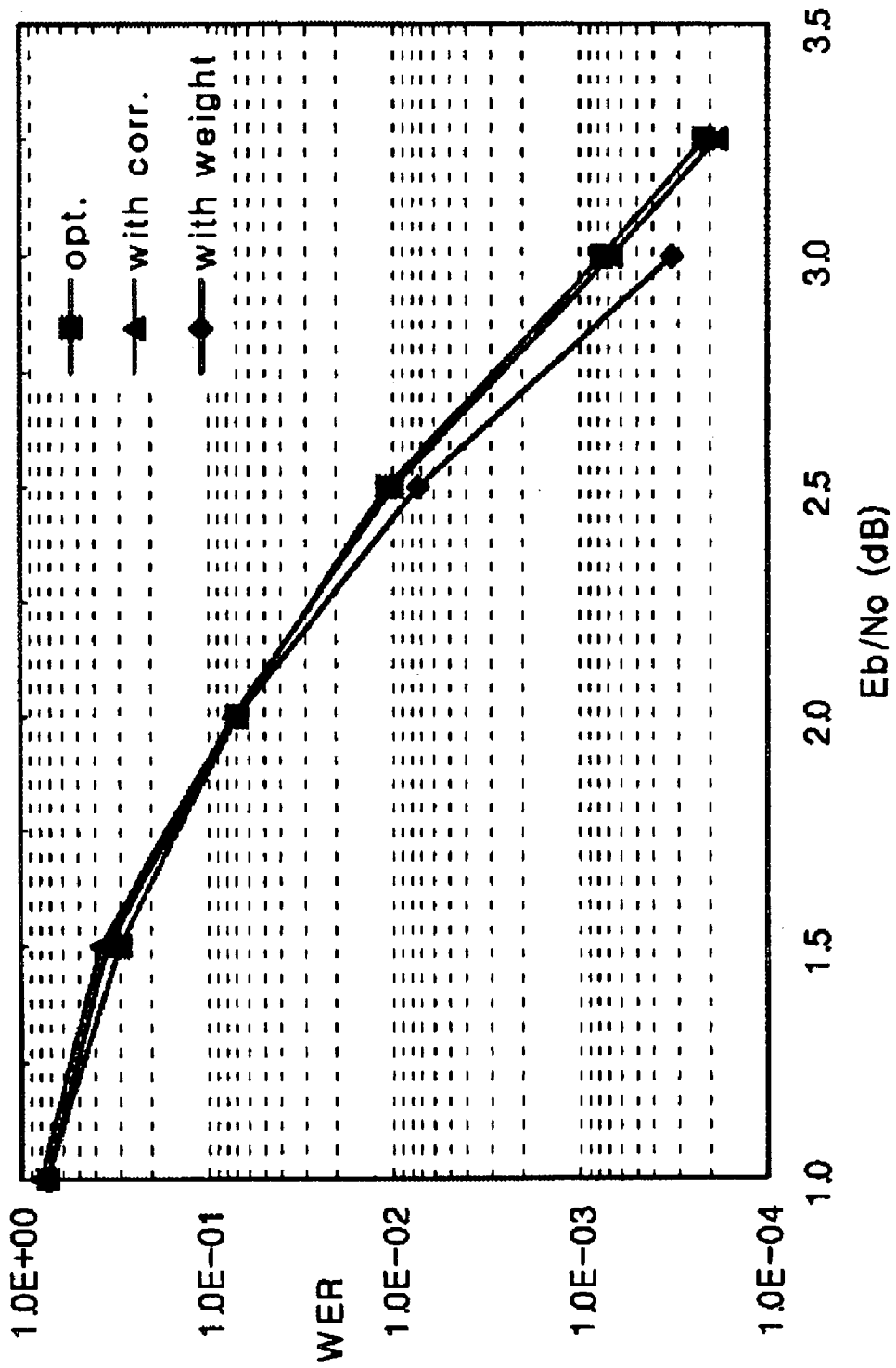
FIG. 6 is a graph illustrating a comparison among word error rates when an LDPC code with a short length is decoded by using the proposed method, the conventional method, and the optimum method on the assumption that the maximum iteration number is set to 50.

The simulation result obtained under this environment is illustrated in FIG. 6. FIG. 6 is a graph illustrating a comparison among word error rates when an LDPC code with a short length is decoded by using the proposed method, the conventional method, and the optimum method on the assumption that the maximum iteration number is set to 50.

In FIG. 6, "opt" represents decoding performance by the optimum sum-product algorithm, "with corr." represents decoding performance by the 'sum-product algorithm with correction factor', and "with weight" represents decoding performance by the 'modified sum-product algorithm with weighting factor' proposed by the invention. It can be understood from FIG. 6 that the decoding performance by the 'modified sum-product algorithm with weighting factor' proposed by an embodiment of the invention shows the most superior WER performance at a high signal-to-noise ratio. This is because the LDPC code with a short length has high probability that short cycles will exist on a randomly defined factor graph, and thus, in many cases, the influence of feedback self-information has a detrimental effect on decoding performance. Generally, as to the influence of the cycle on the factor graph, the LDPC code with a short length has high occurrence probability of a short cycle, causing an increase in degradation probability of decoding performance. In contrast, if a length of an LDPC code is increased, occurrence probability of a short cycle is decreased, thus causing a decrease in the influence. In addition, even though there exists a short cycle, if the iteration number (or the number of iterations) is increased, the influence of the short cycle on decoding performance is also reduced.

The 'modified sum-product algorithm with weighting factor' proposed by an embodiment of the invention can consider a weighting factor smaller than 1 in a variable node message update process, and reduce the influence of self-information fed back by a short cycle existing on a factor graph by the weighting factor. Accordingly, the proposed 'modified sum-product algorithm with weighting factor' shows the most superior performance. Therefore, the 'modified sum-product algorithm with weighting factor' has low computational complexity and shows the most superior WER performance in decoding a randomly generated regular LDC code having a short length.

Figure 7:
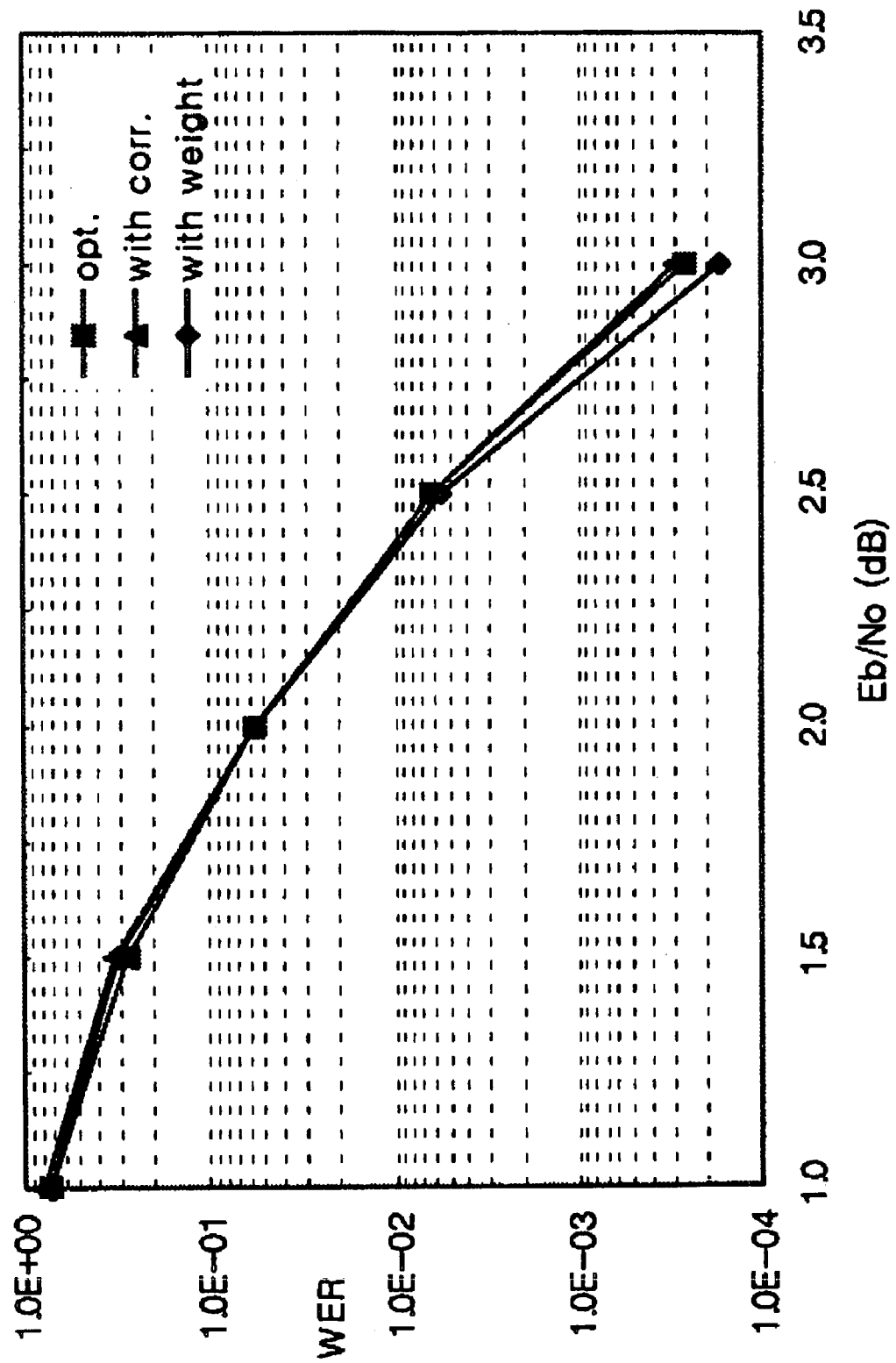
FIG. 7 is a graph illustrating a comparison among word error rates when an LDPC code with a short length is decoded by using by the proposed method, the conventional method, and the optimum method on the assumption that the maximum iteration number is set to 200.

FIG. 7 is a graph illustrating a comparison among word error rates when an LDPC code with a short length is decoded by using by the proposed method, the conventional method, and the optimum method on the assumption that the maximum iteration number is set to 200.

It is noted in FIG. 7 that a performance difference among the three methods is slight since a WER performance difference by a decoding result of the three methods for the LDPC code is smaller as compared with when the maximum iteration number is set to 50. This is because an increase in the iteration number causes a decrease in the influence of a short cycle of the LDPC code.

Next, the simulation for the LDPC code having a long length will be described. The simulation environment is the same as above, except that the number of check nodes and the number of variable nodes of the LDPC code are 4986 and 9972, respectively. Decoding simulation is performed on an LDPC code with a long length by increasing the number of code symbols of a particular LDPC codeword to 9972. In addition, a weighting factor smaller than 1 in the variable node message update process of the 'sum-product algorithm with weighting factor' is also set to the value used in the simulation of the LDPC code having a short length.

Figure 8:
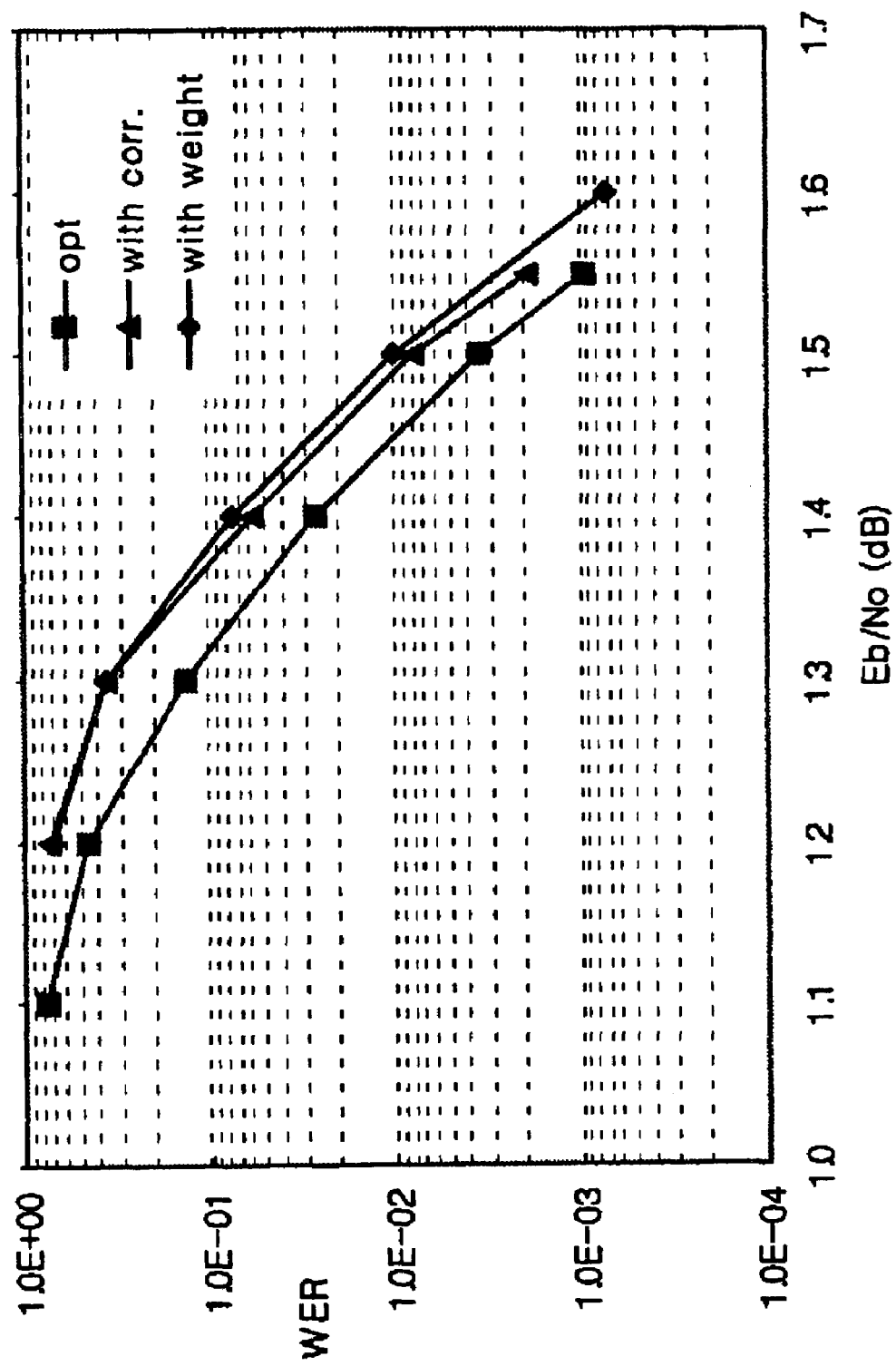
FIG. 8 is a graph illustrating a comparison among word error rates when an LDPC code having a long length is decoded by using the proposed method, the conventional method and the optimum method on the assumption that the maximum iteration number is set to 50.
Figure 9:
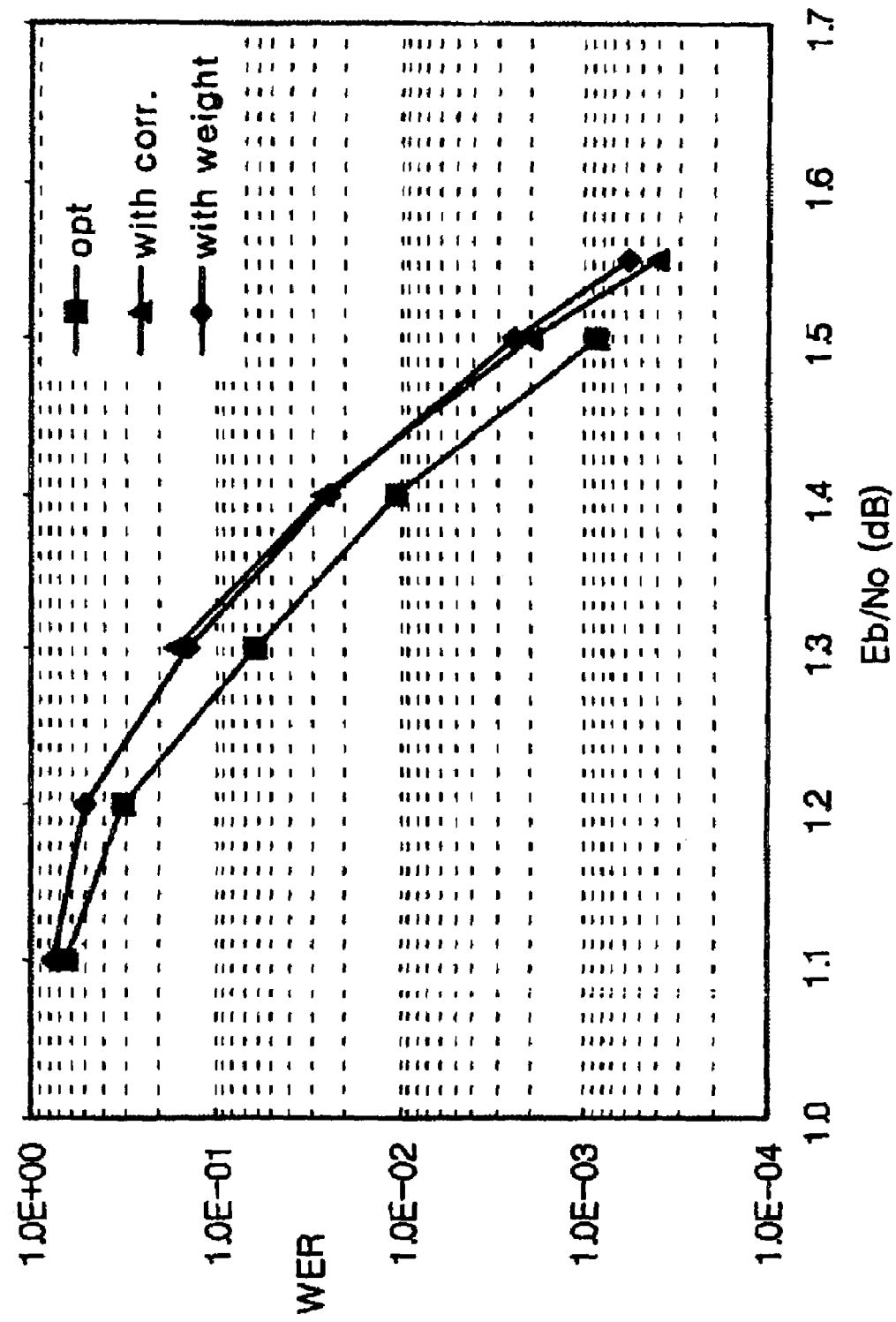
FIG. 9 is a graph illustrating a comparison among word error rates when an LDPC code having a long length is decoded by using the proposed method, the conventional method and the optimum method on the assumption that the maximum iteration number is set to 200.

FIG. 8 is a graph illustrating a comparison among word error rates when an LDPC code having a long length is decoded by using the proposed method, the conventional method and the optimum method on the assumption that the maximum iteration number is set to 50. FIG. 9 is a graph illustrating a comparison among word error rates when an LDPC code having a long length is decoded by using the proposed method, the conventional method and the optimum method on the assumption that the maximum iteration number is set to 200.

Compared with an LPDC code with a short length, an LDPC code with a long length has low occurrence probability of a short cycle on a factor graph, so it has the slight influence of a short cycle on the decoding performance as compared with the LDPC code with a short length. Therefore, it can be noted from FIG. 8 that in the LDPC code with a long length, the optimum sum-product algorithm show the most superior decoding performance. Next, the 'sum-product algorithm with correction factor', which is similar to the optimum sum-product algorithm, shows the second most superior decoding performance, and the proposed 'modified sum-product algorithm with weighting factor' shows the worst decoding performance. This is because the weighting factor proposed by an embodiment of the invention cancels out not only the self-information due to the short cycle but also correct information. This has no influence on an LDPC code with a short length but causes degradation of decoding performance in an LDPC code with a long length. However, as illustrated in FIG. 8, performance degradation by the 'sum-product algorithm with weighting factor' is very slight, and has a difference of about 0.05 dB at WER of $10^{-3}$ as compared with performance by the optimum sum-product algorithm. Further, the performance difference by the 'sum-product algorithm with correction factor' is a negligible level of about 0.01 dB. Comparing FIG. 8 with FIG. 9, the increase in the maximum iteration number causes a reduction in a performance difference between them.

As described above, the use of the proposed modified sum-product algorithm contributes to a reduction in computational complexity in the decoding process. In addition, the various embodiments of the present invention can obtain decoding performance which is superior or similar to decoding performance that can be obtained by using the optimum sum-product algorithm.

While the invention has been shown and described with reference to certain embodiments thereof, it will be understood by those skilled in the art that various changes in form and details may be made therein without departing from the spirit and scope of the invention as defined by the appended claims.

What is claimed is:

1. A forward error correction method for decoding coded bits transmitted over a radio channel after being generated by encoding as many binary bits as the number of rows with low density parity check matrixes having rows and the columns, the method comprising the steps of:
   (a) converting coded bits received over the radio channel into a log likelihood ratio (LLR) value, setting the converted value as an initial input value of variable nodes, and performing an initialization process of all the variable nodes;
   (b) delivering messages applied to the variable nodes to check nodes connected to the variable nodes;
   (c) determining the size of a message by checking a message having a minimum absolute value among other messages delivered from the variable nodes except a message received from a variable node that is to transmit the message, determining a sign of the message having the minimum absolute value by calculating the product of signs of other messages except a message received from a variable node that is to transmit the checked message; and updating messages to be transmitted to the variable nodes
   (d) receiving, by the variable nodes, messages updated in the check nodes connected to the variable nodes, comparing signs of the received messages with a sign of an initial message, applying a weighting factor of 1 to the sum of message received from all other check nodes connected to the variable nodes except the check node that is to transmit the check message when all signs are identical, and when all signs are not identical, multiplying messages received from all other check nodes connected to the variable nodes except the check node that is to transmit the checked message by a weighting factor having a predetermined value smaller than 1, adding up the multiplied values and adding the initial input value to the weighted sum;
   (e) updating, by the variable nodes, an LLR by multiplying the messages received from the check nodes connected to the variable nodes by the weighting factor, and adding up the multiplied values and adding an initial input LLR; and
   (f) hard-deciding the updated LLR value performing parity check on codeword obtained from the hard decision by using the low density parity code matrixes.

2. The forward error correction method of claim 1, wherein when an error occurs, if a current iteration number is smaller than or equal to a predetermined iteration number, the steps (b) to (f) are iteratively performed.

3. The forward error correction method of claim 1, wherein the step (c) is performed by $$r_{mn}^{(j)} \approx \left( \prod_{i=1}^{d_c-1} \mathrm{sgn}(q_i) \right) \min_i |q_i|, i = 1, 2, \ldots, d_c - 1$$

where $$r_{mn}^{(j)}$$

is a value obtained in a $j^{th}$ iterative decoding process in an iterative decoding process, and represents a message transmitted from a check node m to a variable node n, $$q_i^{(j)}$$

represents a message transmitted from a variable node i to a check node m in a $j^{th}$ iterative decoding process, and i indicates a value determined by rearranging variable nodes connected to a check node m from 0 to $d_c-1$.

4. The forward error correction method of claim 1, wherein the step (d) is performed by $$q_{mn}^{(j+1)} = q_{mn}^{(0)} + \alpha_n^{(j)} \sum_{i=1}^{d_v-1} r_i^{(j)},$$

$$\alpha_n^{(j)} = \begin{cases} 1.0 & \text{if} \quad \left| \text{sgn}(q_{mn}^{(0)}) + \sum_{i=0}^{d_v-1} \text{sgn}(r_i^{(j)}) \right| = d_v + 1 \\ f_g & \text{if} \quad \left| \text{sgn}(q_{mn}^{(0)}) + \sum_{i=0}^{d_v-1} \text{sgn}(r_i^{(j)}) \right| < d_v + 1 \end{cases}$$

where $$q_{mn}^{(j+1)}$$

is a value obtained in a $j^{th}$ iterative decoding process, and represents a message transmitted from a variable node n to a check node m, $$r_i^{(j)}$$

represents a message transmitted from a check node i to a variable node n in a $j^{th}$ iterative decoding process, i indicates a value determined by rearranging check nodes connected to a variable node n from 0 to $d_c-1$, sgn(x) is a function indicating a sign of a value x wherein sgn(x)=1 for x>0 and sgn(x)=-1 for x<0, and $d_v$ is the number of edges connected to a variable node n.

5. The forward error correction method of claim 1, wherein the step (e) is performed by $$l_n^{(j+1)} = l_n^{(0)} + \alpha_n^{(j)} \sum_{i=0}^{d_v-1} r_i^{(j)}$$

where $$l_n^{(j+1)}$$

indicates an LLR value defined for a variable node n in a $j^{th}$ iterative decoding process.

6. The forward error correction method of claim 1, further comprising the step of stopping the decoding when no error occurs.

7. The forward error correction method of claim 1, wherein the coded bits received over the radio channel are converted into an LLR value indicating a ratio of probability of zero to probability of one before decoding.

8. A forward error correction apparatus for decoding coded bits transmitted over a radio channel after being generated by encoding as many binary bits as the number of columns with low density parity check matrixes having rows and the columns, the apparatus comprising:

a variable node message determiner for converting each of the coded bits received over the radio channel into a log likelihood ratio (LLR) value, applying the converted values as an initial value of variable nodes, receiving updated messages from check nodes connected to the variable nodes, adding up signs of the received messages and a sign of an initial message, applying a weighting factor of 1 when all signs are identical, and when all signs are not identical, updating a message of a variable node by multiplying weighting factor having a predetermined value smaller than 1 by messages received from all other check nodes, and adding up the multiplied values and the initial value;

a check node message determiner for determining the size of a message by checking a message having a minimum absolute value among other messages delivered from the variable nodes except a messages received from a variable node that is to transmit the message, and determining a sign of a message having the minimum absolute value by calculating the product of signs of other messages except a message received from a variable node that is to transmit the checked message;

an LLR determiner for multiplying messages received from the variable nodes, by a predetermined weighting factor, adding up the multiplied values and determining an LLR value by using a value calculated by adding a channel reliability to the weighted sum;

a hard decision device for generating a hard decision value by decoding an output value of the LLR determiner into a binary bit having a value of zero or one; and a parity checker for performing parity check on the hard decision value by using a low density parity check code.

9. The forward error correction apparatus of claim 8, wherein the parity checker stops decoding the received coded bits when no error occurs.

10. The forward error correction apparatus of claim 8, further comprising an LLR value converter for converting the coded bits received over the radio channel into an LLR value indicating a ratio of probability of zero to probability of one before decoding.

11. The forward error correction apparatus of claim 9, wherein when an error occurs, if a current iteration number is smaller than or equal to a predetermined iteration number, the decoding is iteratively performed.

12. The forward error correction apparatus of claim 8, wherein the check node message is updated by $$r_{mn}^{(j)} \approx \left(\prod_{i=1}^{d_c-1} \text{sgn}(q_i)\right) \min_i |q_i|, \quad i = 1, 2, \ldots, d_c - 1$$

where $$r_{mn}^{(j)}$$

is a value obtained in a $j^{th}$ iterative decoding process in a iterative decoding process, and represents a message transmitted from a check node m to a variable node n, $$q_i^{(j)}$$

represents a message transmitted from a variable node i to a check node m in a $j^{th}$ iterative decoding process, and i indicates a value determined by rearranging variable nodes connected to a check node m from 0 to $d_c-1$.

13. The forward error correction apparatus of claim 8, wherein the variable node message is updated by $$q_{mn}^{(j+1)} = q_{mn}^{(0)} + \alpha_n^{(j)} \sum_{i=1}^{d_v-1} r_i^{(j)},$$

$$\alpha_n^{(j)} = \begin{cases} 1.0 & \text{if } \left|\text{sgn}(q_{mn}^{(0)}) + \sum_{i=0}^{d_v-1} sgn(r_i^{(j)})\right| = d_v + 1 \\ f_g & \text{if } \left|\text{sgn}(q_{mn}^{(0)}) + \sum_{i=0}^{d_v-1} sgn(r_i^{(j)})\right| < d_v + 1 \end{cases}$$

where $$q_{mn}^{(j+1)}$$

is a value obtained in a $j^{th}$ iterative decoding process, and represents a message transmitted from a variable node n to a check node m, $$r_i^{(j)}$$

represents a message transmitted from a check node i to a variable node n in a $j^{th}$ iterative decoding process, i indicates a value determined by rearranging check nodes connected to a variable node n from 0 to $d_c-1$, sgn(x) is a function indicating a sign of a value x wherein sgn(x)=1 for x>0 and sgn(x)=−1 for x<0, and $d_v$ is the number of edges connected to a variable node n.

14. The forward error correction apparatus of claim 8, wherein the LLR is updated by $$l_n^{(j+1)} = l_n^{(0)} + \alpha_n^{(j)} \sum_{i=0}^{d_v-1} r_i^{(j)}$$

where $$l_n^{(j+1)}$$

indicates an LLR value defined for a variable node n in a $j^{th}$ iterative decoding process.

* * * * *